US012563979B2

(12) United States Patent (10) Patent No.: US 12,563,979 B2
Matsuo (45) Date of Patent: Feb. 24, 2026

(54) ETCHING METHOD AND PLASMA PROCESSING APPARATUS

(71) Applicant: Tokyo Electron Limited, Tokyo (JP)

(72) Inventor: Mizuki Matsuo, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 389 days.

(21) Appl. No.: 18/096,035

(22) Filed: Jan. 12, 2023

(65) Prior Publication Data

US 2023/0238250 A1 Jul. 27, 2023

(30) Foreign Application Priority Data

Jan. 27, 2022 (JP) ................................. 2022-011043

(51) Int. Cl.
*H01L 21/3205* (2006.01)
*H01J 37/32* (2006.01)
*H01L 21/02* (2006.01)
*H01L 21/311* (2006.01)
(52) U.S. Cl.
CPC .. *H01L 21/32051* (2013.01); *H01J 37/32449* (2013.01); *H01L 21/02063* (2013.01); *H01L 21/31116* (2013.01); *H01L 21/31144*

(2013.01); *H01J 37/32082* (2013.01); *H01J 37/32816* (2013.01); *H01J 2237/334* (2013.01)
(58) Field of Classification Search
None
See application file for complete search history.

(56) References Cited

U.S. PATENT DOCUMENTS 10,903,109 B2 * 1/2021 Tokashiki ......... H01L 21/76816
2021/0242032 A1 * 8/2021 Colinjivadi ....... H01L 21/31144

FOREIGN PATENT DOCUMENTS

JP 2017163032 A 9/2017
WO 2022159191 A1 7/2022

* cited by examiner

*Primary Examiner* — Roberts P Culbert
(74) *Attorney, Agent, or Firm* — XSENSUS LLP

(57) ABSTRACT

An etching method and a plasma processing apparatus form a recess with an intended shape. The etching method includes (a) providing a substrate, the substrate including a silicon-containing film and a mask on the silicon-containing film; (b) etching the silicon-containing film with a first plasma to form a recess, the first plasma generated from a first process gas; (c) supplying a second plasma to the substrate, the second plasma generated from a second process gas comprising tungsten; and (d) etching the recess with a third plasma generated from a third process gas.

14 Claims, 13 Drawing Sheets

ETCHING METHOD AND PLASMA PROCESSING APPARATUS

CROSS-REFERENCE TO RELATED APPLICATION

This application claims priority to Japanese Patent Application No. 2022-011043 filed on Jan. 27, 2022, the entire disclosure of which is incorporated herein by reference.

BACKGROUND

Technical Field

Exemplary embodiments of the present disclosure relate to an etching method and a plasma processing apparatus.

Description of the Background

Manufacturing electronic devices includes etching of silicon-containing films with plasma. A silicon-containing film is formed from a silicon-containing material such as silicon oxide or silicon nitride. For example, manufacturing a NAND flash memory with a three-dimensional structure includes etching of a multilayer including multiple silicon oxide films and multiple silicon nitride films alternately stacked on one another as the silicon-containing film. The etching of the silicon-containing film uses a mask containing carbon, such as an amorphous carbon mask. The mask has openings. Conventionally, a multilayer may be etched using a fluorine active species contained in plasma generated from a hydrofluorocarbon gas. During the multilayer etching, a carbon-containing deposit forms on a mask to protect the mask.

BRIEF SUMMARY

One or more aspects of the present disclosure are directed to an etching method and a plasma processing apparatus for forming a recess with an intended shape.

An etching method according to an exemplary embodiment includes (a) providing a substrate, the substrate including a silicon-containing film and a mask on the silicon-containing film; (b) etching the silicon-containing film with a first plasma to form a recess, the first plasma generated from a first process gas; (c) supplying a second plasma to the substrate, the second plasma generated from a second process gas comprising tungsten; and (d) etching the recess with a third plasma generated from a third process gas.

DETAILED DESCRIPTION

Figure 1:
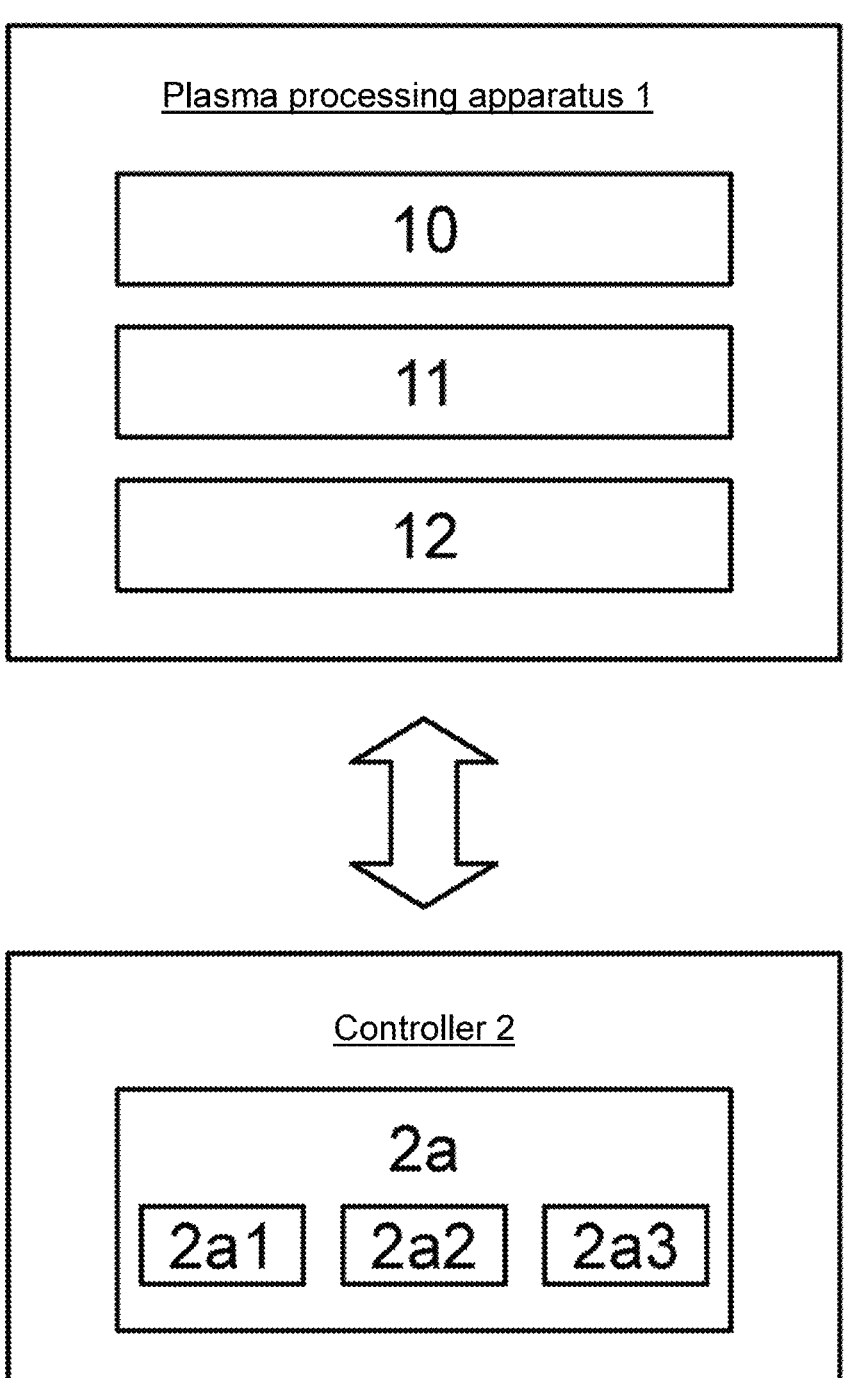
FIG. 1 is a schematic diagram of a plasma processing system according to an exemplary embodiment.

Exemplary embodiments will now be described.

An etching method according to an exemplary embodiment includes (a) providing a substrate including a silicon-containing film and a mask on the silicon-containing film, (b) etching, after (a), the silicon-containing film with first plasma generated from a first process gas to form a recess, (c) supplying, after (b), second plasma generated from a second process gas comprising tungsten to the substrate, and (d) etching, after (c), the recess with third plasma generated from a third process gas.

With the above etching method, the recess can have less edge roughness. The recess thus has an intended shape. The mechanism is identified as described below, but is not limited to this example. The side walls of the recess are unevenly charged with a positive charge, partially forming a positively charged portion in the side walls of the recess. When process (c) is not performed, positive ions in plasma for etching bounce off the positively charged portion to etch the opposite side wall. This causes more edge roughness of the recess. When process (c) is performed, conductive tungsten-containing layers are formed on the side walls of the recess. This removes the positive charge on the charged side wall. This directs the positive ions more linearly into the recess, allowing the recess to have less edge roughness.

In process (c), the tungsten-containing layers may be formed on the side walls of the recess. In this case, the tungsten-containing layers can remove a charge on the side walls of the recess.

In process (b), the first plasma may be generated at a first pressure. In process (c), the second plasma may be generated at a second pressure higher than the first pressure. This facilitates formation of the tungsten-containing layers on the side walls of the recess in process (c).

In process (b), first radio-frequency (RF) power may be provided to generate the first plasma. In process (c), second RF power lower than the first RF power may be provided to generate the second plasma. This facilitates formation of the tungsten-containing layers on the side walls of the recess in process (c).

The etching method may further include process (e) of removing a deposit in an opening in the mask resulting from process (b) between processes (b) and (c). In this case, the opening in the mask can be less narrow.

The etching method may further include process (0 of supplying fourth plasma generated from a fourth process gas containing an oxygen-containing gas to the substrate between processes (b) and (c). In this case, an organic substance adhering to the substrate can be removed.

Processes (c) and (d) may be repeated after process (d). In this case, the recess has less edge roughness further.

The silicon-containing film may include first layers containing the first material including silicon and second layers containing the second material different from the first material. The first layers and the second layers may be alternately stacked on one another.

The first material may include silicon oxide.

The second material may include silicon nitride.

The second process gas may contain a tungsten-containing gas.

The second process gas may contain a tungsten hexafluoride gas.

The first process gas may contain a $C_xH_yF_z$ gas (x and z are integers greater than or equal to 1, and y is an integer greater than or equal to 0).

The third process gas may contain a $C_xH_yF_z$ gas (x and z are integers greater than or equal to 1, and y is an integer greater than or equal to 0).

An etching method according to an exemplary embodiment includes (a) providing a substrate including a silicon-containing film and a mask on the silicon-containing film including silicon oxide films and silicon nitride films alternately stacked on one another, (b) etching, after (a), the silicon-containing film with first plasma generated from a first process gas containing a $C_xH_yF_z$ gas and an oxygen-containing gas to form a recess, where x and z are integers greater than or equal to 1, and y is an integer greater than or equal to 0, (c) forming, after (b), a tungsten-containing layer on a side wall of the recess by supplying second plasma generated from a second process gas containing a tungsten hexafluoride gas to the substrate, and (d) etching, after (c), the recess with third plasma generated from a third process gas containing a $C_xH_yF_z$ gas and an oxygen-containing gas, where x and z are integers greater than or equal to 1, and y is an integer greater than or equal to 0.

A plasma processing apparatus according to an exemplary embodiment includes a chamber, a substrate support that supports, in the chamber, a substrate including a silicon-containing film and a mask on the silicon-containing film, a gas supply unit that supplies a first process gas, a second process gas containing tungsten, and a third process gas into the chamber, a plasma generator that generates, in the chamber, first plasma from the first process gas, second plasma from the second process gas, and third plasma from the third process gas, and a controller that controls the gas supply unit and the plasma generator to etch the silicon-containing film with the first plasma to form a recess, to supply the second plasma to the substrate after forming the recess, and to etch the recess with the third plasma after supplying the second plasma to the substrate.

Exemplary embodiments will now be described in detail with reference to the drawings. In the drawings, similar or corresponding components are indicated by like reference numerals.

FIG. 1 is a diagram of a plasma processing system showing its example structure. In one embodiment, the plasma processing system includes a plasma processing apparatus 1 and a controller 2. The plasma processing system is an example of a substrate processing system. The plasma processing apparatus 1 is an example of a substrate processing apparatus. The plasma processing apparatus 1 includes a plasma processing chamber 10, a substrate support 11, and a plasma generator 12. The plasma processing chamber 10 has a plasma processing space. The plasma processing chamber 10 has at least one gas inlet for supplying at least one process gas into the plasma processing space and at least one gas outlet for discharging the gas from the plasma processing space. The gas inlet connects to a gas supply unit 20 (described later). The gas outlet connects to an exhaust system 40 (described later). The substrate support 11 is located in the plasma processing space and has a substrate support surface for supporting a substrate.

The plasma generator 12 generates plasma from at least one process gas supplied into the plasma processing space. The plasma generated in the plasma processing space may be capacitively coupled plasma (CCP), inductively coupled plasma (ICP), electron cyclotron resonance (ECR) plasma, helicon wave plasma (HWP), or surface wave plasma (SWP). Various plasma generators including an alternating current (AC) plasma generator and a direct current (DC) plasma generator may be used. In one embodiment, an AC signal (AC power) used in the AC plasma generator has a frequency in a range of 100 kHz to 10 GHz. Thus, the AC signal includes an RF signal and a microwave signal. In one embodiment, the RF signal has a frequency in a range of 100 kHz to 150 MHz.

The controller 2 processes computer-executable instructions that cause the plasma processing apparatus 1 to perform various steps described in one or more embodiments of the present disclosure. The controller 2 may control the components of the plasma processing apparatus 1 to perform various steps described herein. In one embodiment, some or all of the components of the controller 2 may be included in the plasma processing apparatus 1. The controller 2 may include a processor 2a1, a storage device (a non-transitory memory) 2a2, and a communication interface 2a3. The controller 2 is implemented by, for example, a computer 2a. The processor 2a1 may perform various control operations by reading a program from the storage 2a2 and executing the read program. In this way, the processor 2a1 may be configured by via its execution of software instructions (which are part of the program) to perform the control processes described herein. This program may be prestored in the storage 2a2 or may be obtained through a medium as appropriate. The obtained program is stored into the storage 2a2, read from the storage 2a2, and executed by the processor 2a1. The medium may be one of various storage media readable by the computer 2a, or a communication line connected to the communication interface 2a3. The processor 2a1 may be a central processing unit (CPU).

The storage 2a2 may be a random-access memory (RAM), a read-only memory (ROM), a hard disk drive (HDD), a solid-state drive (SSD), or a combination of these memories. The communication interface 2a3 may communicate with the plasma processing apparatus 1 through a communication line such as a local area network (LAN). A more detailed description of the controller 2 is provided in FIG. 13, discussed below.

Figure 2:
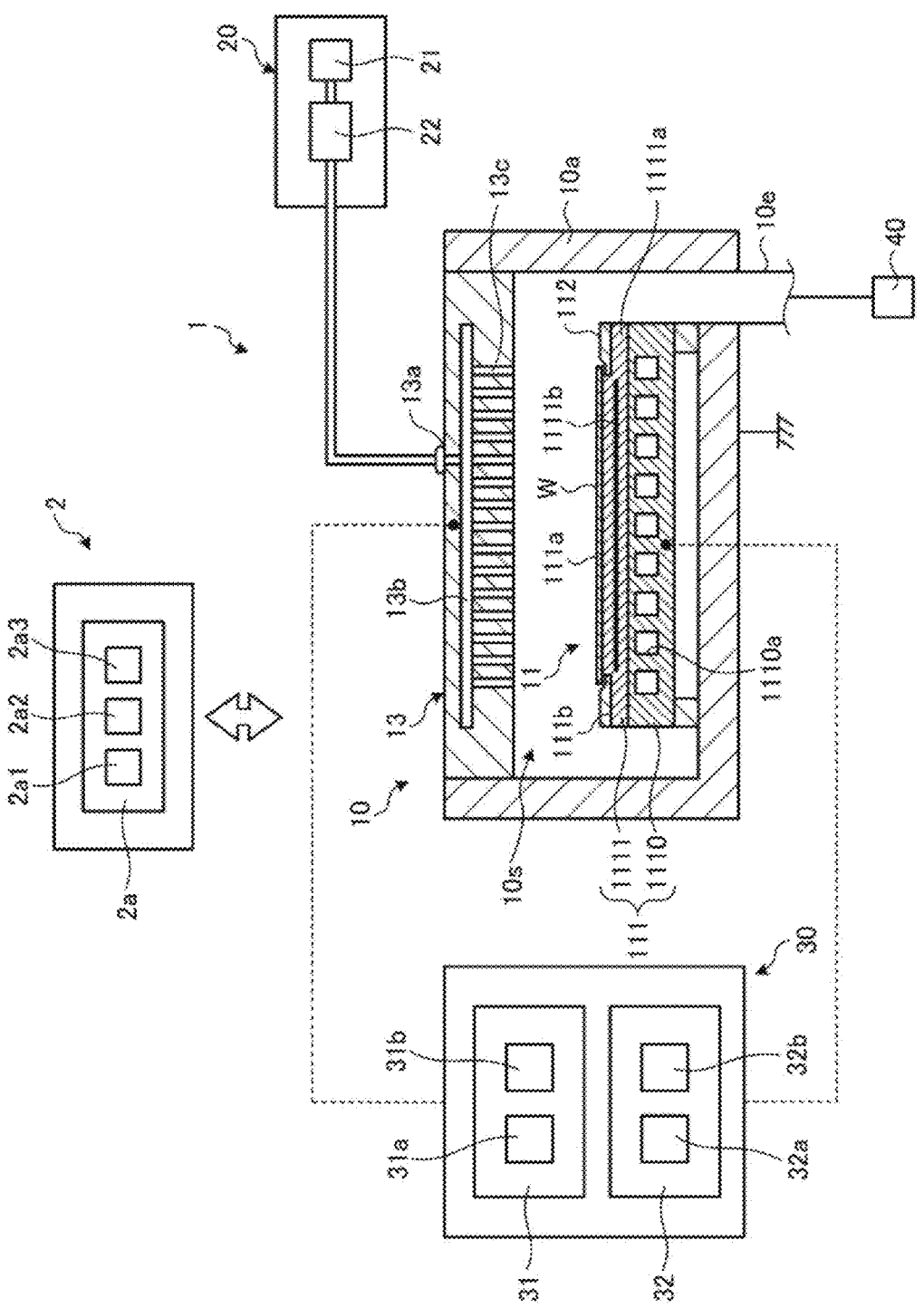
FIG. 2 is a schematic diagram of a plasma processing apparatus according to an exemplary embodiment.

An example structure of a capacitively coupled plasma processing apparatus as an example of the plasma processing apparatus 1 will now be described. FIG. 2 is a diagram of the capacitively coupled plasma processing apparatus showing its example structure.

The capacitively coupled plasma processing apparatus 1 includes the plasma processing chamber 10, the gas supply unit 20, a power supply 30, and the exhaust system 40. The plasma processing apparatus 1 also includes the substrate support 11 and a gas inlet unit. The gas inlet unit allows at least one process gas to be introduced into the plasma processing chamber 10. The gas inlet unit includes a shower head 13. The substrate support 11 is located in the plasma processing chamber 10. The shower head 13 is located above the substrate support 11. In one embodiment, the shower head 13 defines at least a part of the ceiling of the plasma processing chamber 10. The plasma processing chamber 10 has a plasma processing space 10s defined by the shower head 13, a side wall 10a of the plasma processing chamber 10, and the substrate support 11. The plasma processing chamber 10 is grounded. The shower head 13 and the substrate support 11 are electrically insulated from a housing of the plasma processing chamber 10.

The substrate support 11 includes a body 111 and a ring assembly 112. The body 111 includes a central area 111a for supporting a substrate W and an annular area 111b for supporting the ring assembly 112. A wafer is an example of the substrate W. The annular area 111b of the body 111 surrounds the central area 111a of the body 111 as viewed in plan. The substrate W is located on the central area 111a of the body 111. The ring assembly 112 is located on the annular area 111b of the body 111 to surround the substrate W on the central area 111a of the body 111. Thus, the central area 111a is also referred to as a substrate support surface for supporting the substrate W, and the annular area 111b is also referred to as a ring support surface for supporting the ring assembly 112.

In one embodiment, the body 111 includes a base 1110 and an electrostatic chuck (ESC) 1111. The base 1110 includes a conductive member. The conductive member in the base 1110 may function as a lower electrode. The ESC 1111 is located on the base 1110. The ESC 1111 includes a ceramic member 1111a and an electrostatic electrode 1111b located inside the ceramic member 1111a. The ceramic member 1111a includes the central area 111a. In one embodiment, the ceramic member 1111a also includes the annular area 111b. Other members surrounding the ESC 1111, such as an annular ESC or an annular insulating member, may include the annular area 111b. In this case, the ring assembly 112 may be located on the annular ESC or the annular insulating member, or may be located on both the ESC 1111 and the annular insulating member. At least one RF electrode or at least one DC electrode or both the electrodes coupled to an RF power supply 31 or a DC power supply 32 or to both the power supplies (described later) may be located in the ceramic member 1111a. In this case, at least one RF electrode or at least one DC electrode, or both the electrodes serve as a lower electrode. When a bias RF signal or a DC signal or both (described later) are provided to at least one RF electrode or at least one DC electrode or to both the electrodes, the RF electrode or the DC electrode, or both the electrodes are also referred to as a bias electrode(s). The conductive member in the base 1110 and at least one RF electrode or at least one DC electrode, or both the electrodes may function as multiple lower electrodes. The electrostatic electrode 1111b may also function as a lower electrode. Thus, the substrate support 11 includes at least one lower electrode.

The ring assembly 112 includes one or more annular members. In one embodiment, one or more annular members include one or more edge rings and at least one cover ring. The edge ring is formed from a conductive material or an insulating material. The cover ring is formed from an insulating material.

The substrate support 11 may also include a temperature control module that adjusts at least one of the ESC 1111, the ring assembly 112, or the substrate W to a target temperature. The temperature control module may include a heater, a heat-transfer medium, a channel 1110a, or a combination of these. The channel 1110a allows a heat-transfer fluid such as brine or gas to flow. In one embodiment, the channel 1110a is defined in the base 1110, and one or more heaters are located in the ceramic member 1111a in the ESC 1111. The substrate support 11 may include a heat-transfer gas supply unit to supply a heat-transfer gas to a space between the back surface of the substrate W and the central area 111a.

The shower head 13 introduces at least one process gas from the gas supply unit 20 into the plasma processing space 10s. The shower head 13 has at least one gas inlet 13a, at least one gas diffusing compartment 13b, and multiple gas inlet ports 13c. The process gas supplied to the gas inlet 13a passes through the gas diffusing compartment 13b and is introduced into the plasma processing space 10s through the multiple gas inlet ports 13c. The shower head 13 also includes at least one upper electrode. In addition to the shower head 13, the gas inlet unit may include one or more side gas injectors (SGIs) that are installed in one or more openings in the side wall 10a.

The gas supply unit 20 (sometimes called a gas supply) may include at least one gas source 21 and at least one flow controller 22. In one embodiment, the gas supply unit 20 allows supply of at least one process gas from each gas source 21 to the shower head 13 through the corresponding flow controller 22. The flow controllers 22 may include a mass flow controller or a pressure-based flow controller. The gas supply unit 20 may further include at least one flow rate modulator that supplies at least one process gas at a modulated flow rate or in a pulsed manner.

The power supply 30 includes the RF power supply 31 that is coupled to the plasma processing chamber 10 through at least one impedance matching circuit. The RF power supply 31 allows supply of at least one RF signal (RF power) to at least one lower electrode or at least one upper electrode, or to both the electrodes. This causes plasma to be generated from at least one process gas supplied into the plasma processing space 10s. The RF power supply 31 may thus at least partially serve as the plasma generator 12. A bias RF signal is provided to at least one lower electrode to generate a bias potential in the substrate W, thus drawing ion components in the plasma to the substrate W.

In one embodiment, the RF power supply 31 includes a first RF generator 31a and a second RF generator 31b. The first RF generator 31a is coupled to at least one lower electrode or at least one upper electrode, or to both the electrodes through at least one impedance matching circuit and generates a source RF signal (source RF power) for plasma generation. In one embodiment, the source RF signal has a frequency in a range of 10 to 150 MHz. In one embodiment, the first RF generator 31a may generate multiple source RF signals with different frequencies. The generated one or more source RF signals are provided to at least one lower electrode or at least one upper electrode, or to both the electrodes.

The second RF generator 31b is coupled to at least one lower electrode through at least one impedance matching circuit and generates a bias RF signal (bias RF power). The frequency of the bias RF signal may be the same as or different from the frequency of the source RF signal. In one embodiment, the bias RF signal has a lower frequency than the source RF signal. In one embodiment, the bias RF signal has a frequency in a range of 100 kHz to 60 MHz. In one embodiment, the second RF generator 31b may generate multiple bias RF signals with different frequencies. The generated one or more bias RF signals are provided to at least one lower electrode. In various embodiments, at least one of the source RF signal or the bias RF signal may be pulsed.

The power supply 30 may also include the DC power supply 32 coupled to the plasma processing chamber 10. The DC power supply 32 includes a first DC generator 32a and a second DC generator 32b. In one embodiment, the first DC generator 32a is connected to at least one lower electrode and generates a first DC signal. The generated first DC signal is applied to at least one lower electrode. In one embodiment, the second DC generator 32b is connected to at least one upper electrode and generates a second DC signal. The generated second DC signal is applied to at least one upper electrode.

In various embodiments, the first DC signal and the second DC signal may be pulsed. In this case, a sequence of voltage pulses is applied to at least one lower electrode or at least one upper electrode, or to both the electrodes. The voltage pulse may have a rectangular, trapezoidal, or triangular pulse waveform, or a combination of these pulse waveforms. In one embodiment, a waveform generator for generating a sequence of voltage pulses based on DC signals is connected between the first DC generator 32a and at least one lower electrode. Thus, the first DC generator 32a and the waveform generator are included in a voltage pulse generator. When the second DC generator 32b and the waveform generator are included in a voltage pulse generator, the voltage pulse generator is connected to at least one upper electrode. The voltage pulses may have positive or negative polarity. The sequence of voltage pulses may also include one or more positive voltage pulses and one or more negative voltage pulses within one cycle. The first DC generator 32a and the second DC generator 32b may be provided in addition to the RF power supply 31, or the first DC generator 32a may replace the second RF generator 31b.

The exhaust system 40 may be, for example, connected to a gas outlet 10e in the bottom of the plasma processing chamber 10. The exhaust system 40 may include a pressure control valve and a vacuum pump. The pressure control valve regulates the pressure in the plasma processing space 10s. The vacuum pump may include a turbomolecular pump, a dry pump, or a combination of these.

Figure 3:
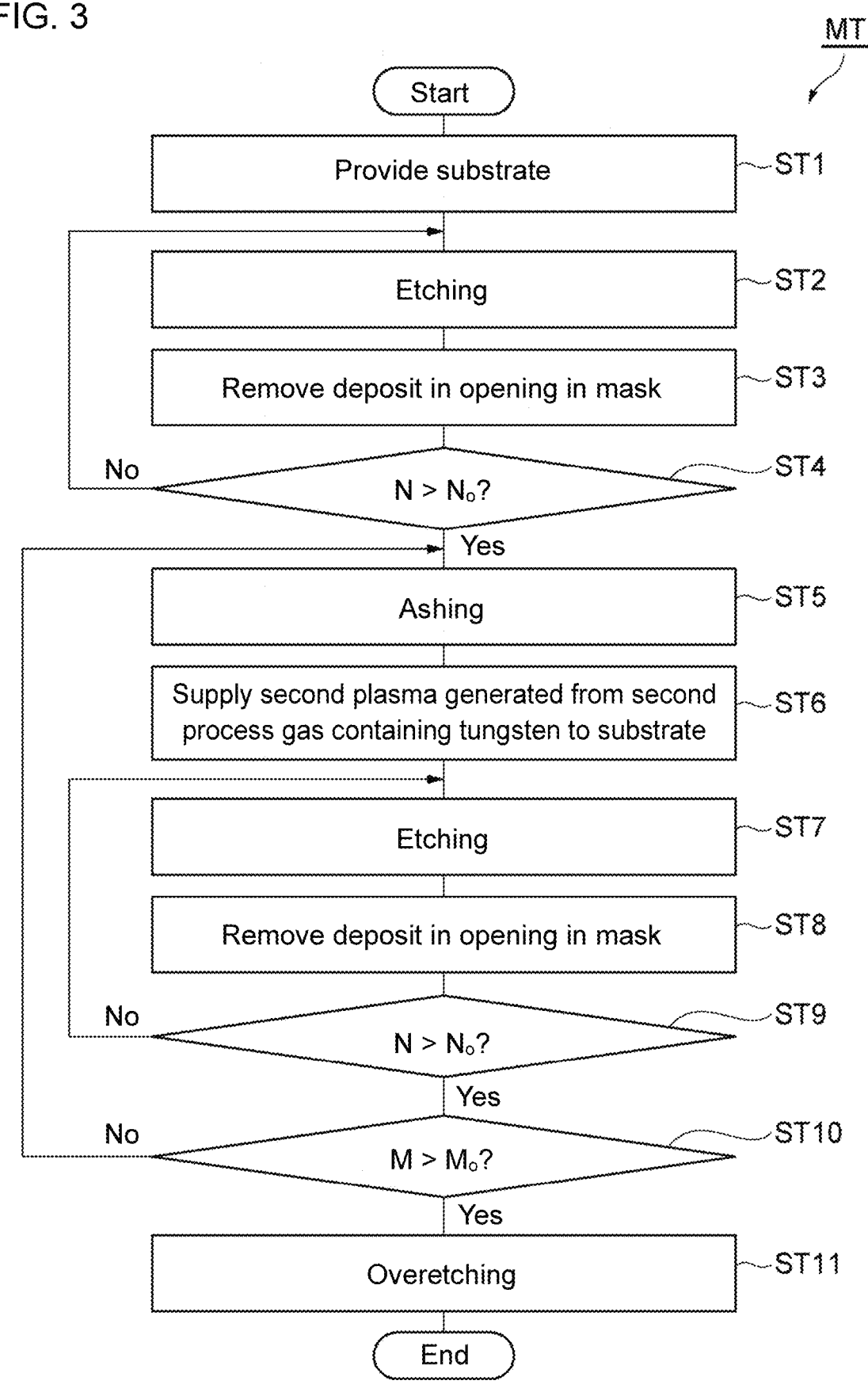
FIG. 3 is a flowchart of an etching method according to an exemplary embodiment.

FIG. 3 is a flowchart of an etching method according to an exemplary embodiment. An etching method MT shown in FIG. 3 (hereafter referred to as a method MT) may be implemented by the plasma processing apparatus 1 according to the above embodiment. The method MT may be used for the substrate W.

Figure 4:
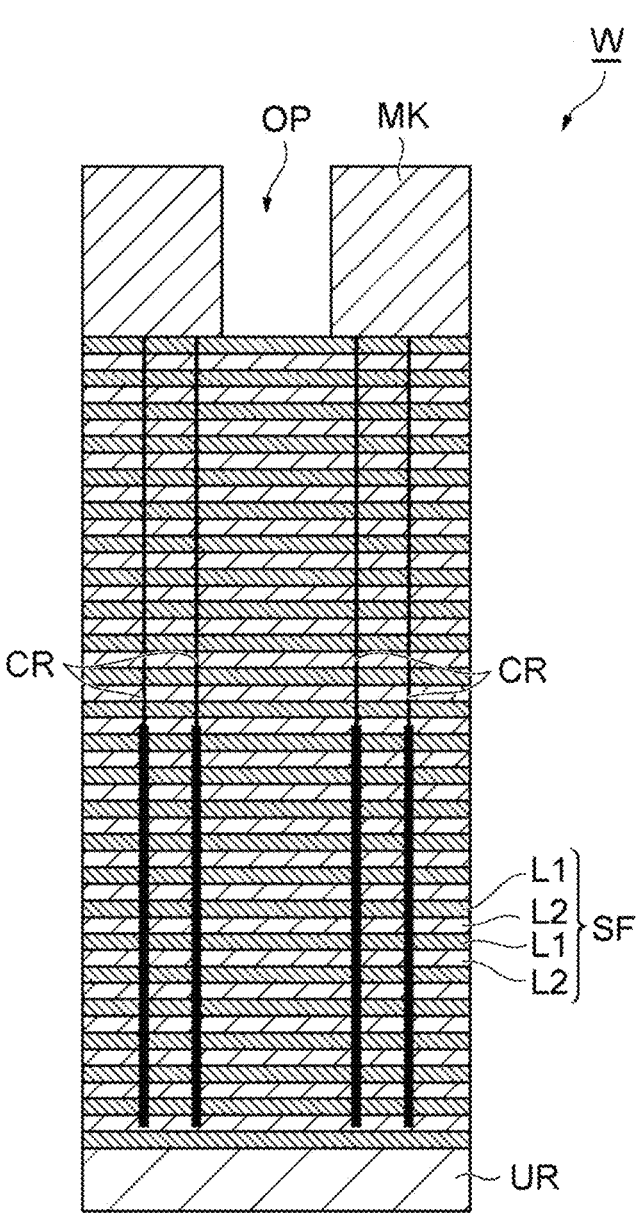
FIG. 4 is a cross-sectional view of an exemplary substrate to be processed with the method shown in FIG. 3.

FIG. 4 is a cross-sectional view of an exemplary substrate to be processed with the method shown in FIG. 3. In one embodiment, the substrate W includes a silicon-containing film SF and a mask MK on the silicon-containing film SF as shown in FIG. 4. The substrate W may include an underlying region UR. The silicon-containing film SF may be located on the underlying region UR.

The mask MK may contain carbon. The mask MK may contain amorphous carbon. The mask MK may have at least one opening OP in the silicon-containing film SF. The mask MK may have multiple openings OP. Each opening OP may be a hole pattern or a line pattern. Each opening OP may have a dimension (a width) of 500 nm or less.

The silicon-containing film SF may include a first layer L1 and a second layer L2. The silicon-containing film SF may include multiple first layers L1 and multiple second layers L2. The first layers L1 and the second layers L2 may be alternately stacked on one another.

The first layer L1 may contain the first material. The first material may include silicon. The first material may include silicon oxide ($SiO_x$) and polysilicon. The second layer L2 may contain the second material. The second material may include silicon. The second material is different from the first material. The second material may include silicon nitride ($SiN_x$), polysilicon, and an organic substance.

The underlying region UR may contain at least one of silicon or metal. The underlying region UR may contain polysilicon or tungsten.

The substrate W may include at least one conductive portion CR located in the silicon-containing film SF. Multiple conductive portions CR may be located in the silicon-containing film SF. Each conductive portion CR may extend downward from the mask MK. Each conductive portion CR may extend in the stacking direction of the first layer L1 and the second layer L2. The conductive portion CR may have its lower end distant from the underlying region UR.

Figure 5:
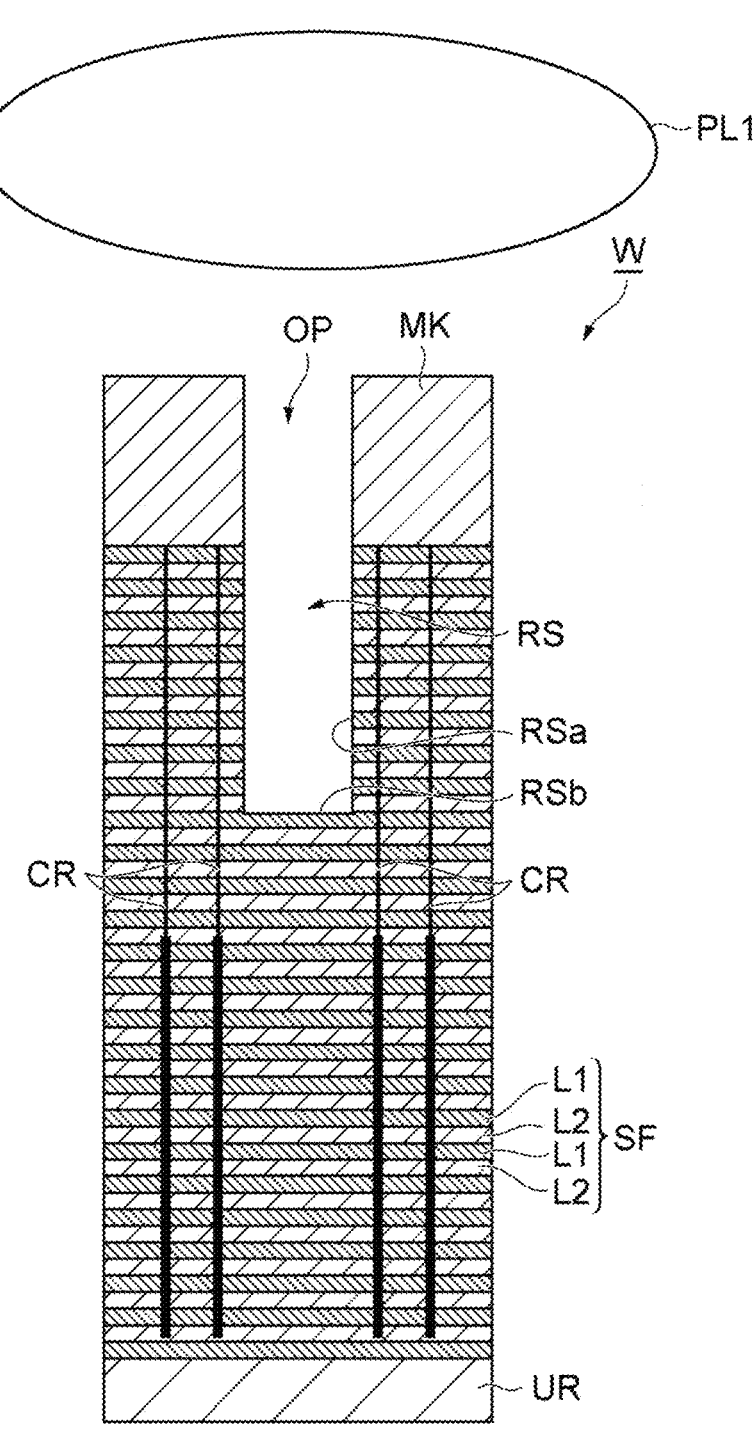
FIG. 5 is a cross-sectional view showing a processing of the substrate in an etching method according to an exemplary embodiment.
Figure 6:
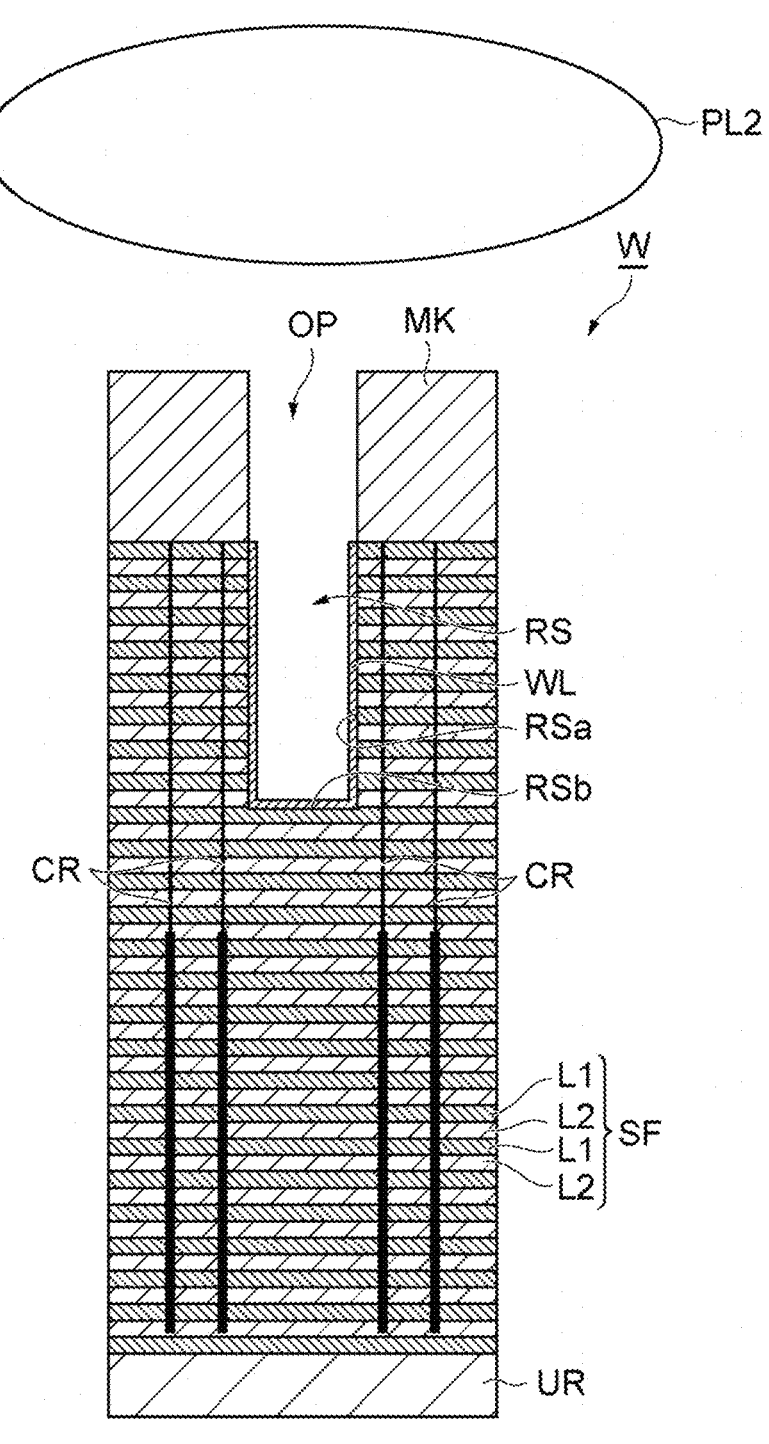
FIG. 6 is a cross-sectional view showing a processing of the substrate in the etching method according to the exemplary embodiment.
Figure 7:
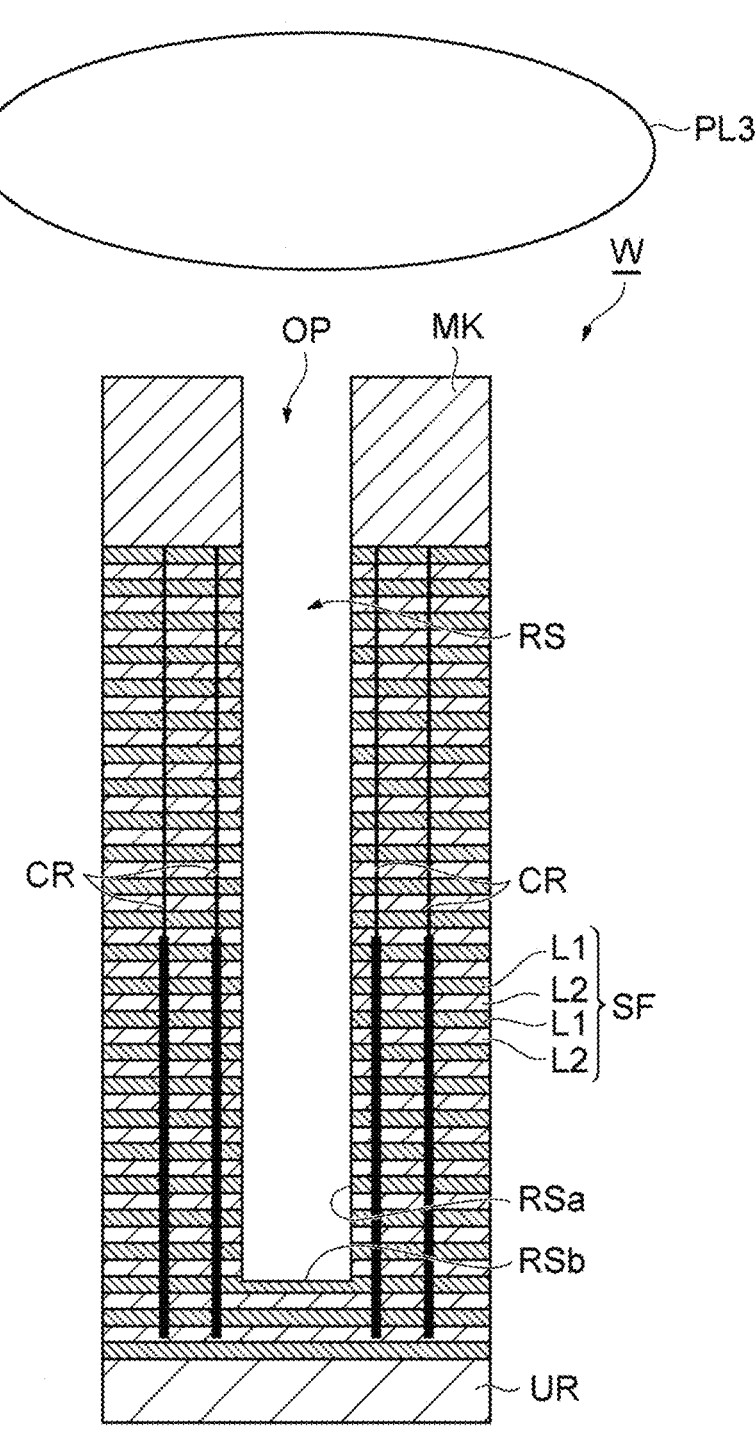
FIG. 7 is a cross-sectional view showing a processing of the substrate in the etching method according to the exemplary embodiment.
Figure 8:
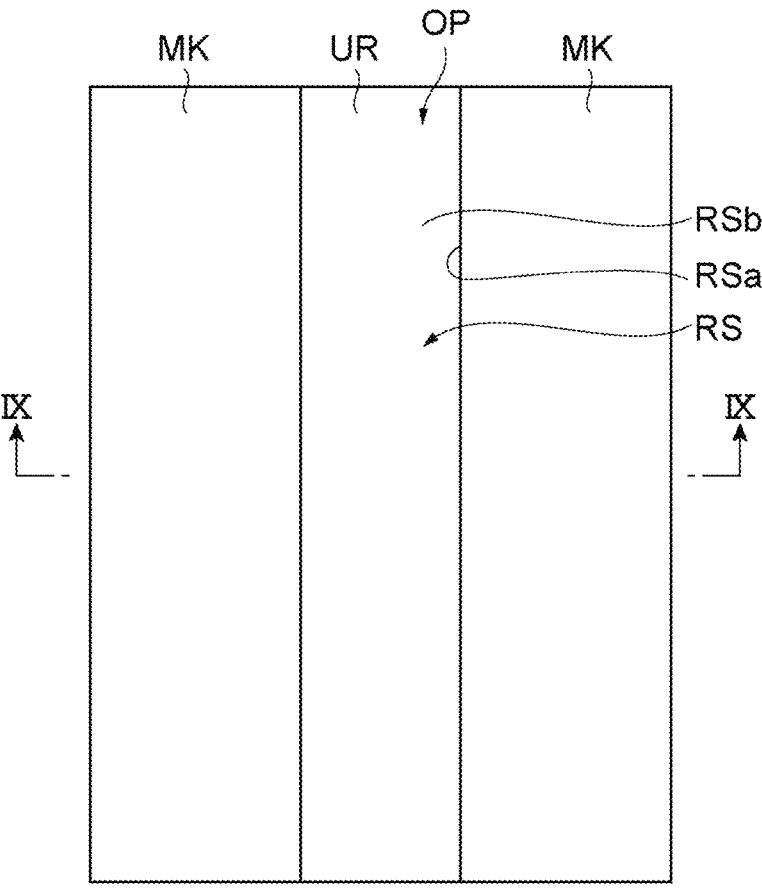
FIG. 8 is a plan view showing a processing of the substrate in the etching method according to the exemplary embodiment.
Figure 9:
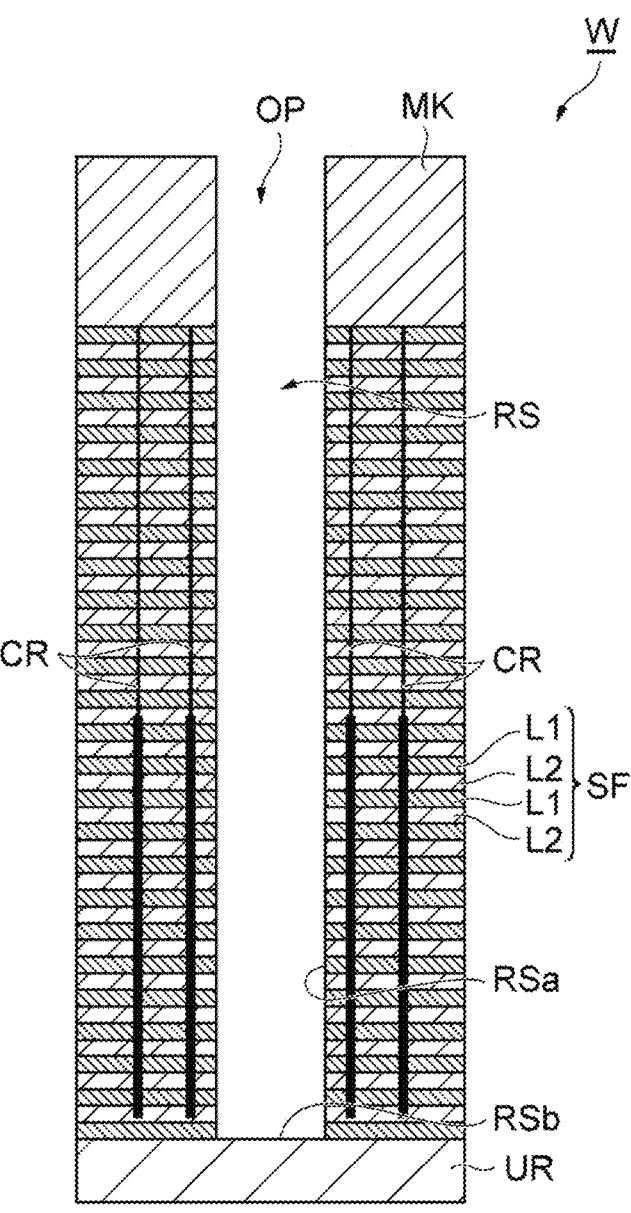
FIG. 9 is a cross-sectional view taken along line IX-IX in FIG. 8.

The method MT used by the plasma processing apparatus 1 according to the above embodiment to process the substrate W will now be described by way of example with reference to FIGS. 3-9. FIGS. 5-7 are each a cross-sectional view showing a processing of substrate W in the etching method according to an exemplary embodiment. FIG. 8 is a plane view showing a processing of substrate W in the etching method according to the exemplary embodiment. FIG. 9 is a cross-sectional view taken along line IX-IX in FIG. 8. The components of the plasma processing apparatus 1 are controlled by the controller 2 to allow the plasma processing apparatus 1 to implement the method MT. With the method MT, the substrate W on the substrate support 11 (substrate support) located in the plasma processing chamber 10 is processed as shown in FIG. 2.

As shown in FIG. 3, the method MT may include steps ST1 to ST11. Steps ST1 to ST11 may be performed sequentially. However, some steps in the method MT may be removed or skipped, and various steps may be performed non-sequentially. For example, the method MT may omit at least one of steps ST3 to ST5 and ST8 to ST11.

In step ST1, the substrate W shown in FIG. 4 is provided. The substrate W may be supported by the substrate support 11 in the plasma processing chamber 10. The underlying region UR may be located between the silicon-containing film SF and the substrate support 11.

In step ST2, the silicon-containing film SF is etched with first plasma PL1 generated from a first process gas to form a recess RS as shown in FIG. 5. The recess RS may have side walls RSa and a bottom RSb. The recess RS corresponds to the opening OP in the mask MK.

The first process gas may contain a gas containing carbon and fluorine. The first process gas may contain a $C_xH_yF_z$ gas (x and z are integers greater than or equal to 1, and y is an integer greater than or equal to 0). The first process gas may contain an oxygen-containing gas. The oxygen-containing gas may contain an oxygen gas and a carbonyl sulfide (COS) gas.

The first plasma PL1 may be generated at a first pressure. The first pressure may be a pressure in the plasma processing chamber 10. In step ST2, first RF power may be provided to generate the first plasma PL1. The first RF power may be RF power HF provided to the upper electrode in the plasma processing apparatus 1. In step ST2, bias power LF may be provided to the electrode in the body 111 of the substrate support 11.

Step ST2 may be performed as described below. The gas supply unit 20 first supplies the first process gas into the plasma processing chamber 10. The plasma generator 12 then generates the first plasma PL1 from the first process gas in the plasma processing chamber 10. The controller 2 controls the gas supply unit 20 and the plasma generator 12 to etch the silicon-containing film SF to form the recess RS with the first plasma PL1.

In step ST3, a deposit (necking) in the opening OP in the mask MK resulting from step ST2 is removed. The deposit may narrow the opening OP. The deposit may contain carbon. In step ST3, the recess RS may be etched. In step ST3, plasma generated from a process gas may be supplied to the substrate W. The process gas in step ST3 may contain a gas containing carbon and fluorine and an oxygen-containing gas. The gas containing carbon and fluorine in step ST3 may have a lower flow rate than the gas containing carbon and fluorine in step ST2. The oxygen-containing gas in step ST3 may have a higher flow rate than the oxygen-containing gas in step ST2.

In step ST4, the determination is performed as to whether a processing count N in step ST2 is greater than a threshold No. When the processing count N is less than the threshold No, the processing returns to step ST2. In this case, steps ST2 and ST3 are repeated. When the processing count N is greater than the threshold No, the processing advances to subsequent step ST5. For example, with the threshold No set to 3, step ST2 is performed four times.

In step ST5, fourth plasma generated from a fourth process gas containing an oxygen-containing gas is supplied to the substrate W. Ashing is thus performed. The oxygen-containing gas may contain an oxygen gas. The fourth process gas may contain an inert gas. The inert gas may contain a noble gas. The noble gas may contain at least one of a helium gas, a neon gas, an argon gas, a krypton gas, or a xenon gas.

In step ST6, second plasma PL2 generated from a second process gas containing tungsten is supplied to the substrate W as shown in FIG. 6. The second plasma PL2 may be supplied to the recess RS. Tungsten-containing layers WL may be formed on the side walls RSa of the recess RS. The tungsten-containing layer WL may be formed on the bottom RSb of the recess RS. In step ST6, the recess RS may be etched.

The second process gas may contain a tungsten-containing gas. The tungsten-containing gas may contain a tungsten halide gas. The tungsten halide gas may contain at least one of a tungsten hexafluoride (WF6) gas, a tungsten hexabromide (WBr6) gas, a tungsten hexachloride (WC16) gas, or a WF5Cl, gas. The tungsten-containing gas may contain a tungsten hexacarbonyl (W(CO)6) gas. The tungsten-containing gas may have a flow rate of 10 sccm or less.

The second process gas may contain at least one of an oxygen-containing gas or an inert gas. The oxygen-containing gas may contain an oxygen gas. The inert gas may contain a noble gas. The noble gas may contain at least one of a helium gas, a neon gas, an argon gas, a krypton gas, or a xenon gas. The second process gas may not contain carbon.

The second plasma PL2 may be generated at a second pressure. The second pressure may be a pressure in the plasma processing chamber 10. The second pressure is higher than the first pressure in step ST2. This facilitates formation of the tungsten-containing layers WL on the side walls RSa of the recess RS in step ST6. The second pressure may be 10 mTorr (1.333 Pa) or higher. The second pressure may be 100 mTorr (13.33 Pa) or lower.

In step ST6, second RF power may be provided to generate the second plasma PL2. The second RF power may be RF power HF provided to the upper electrode in the plasma processing apparatus 1. The second RF power is lower than the first RF power in step ST2. This facilitates formation of the tungsten-containing layers WL on the side walls RSa of the recess RS in step ST6. The second RF power may have a power of 100 W or higher. The second RF power may have a power of 1000 W or lower. In step ST6, the bias power LF may not be provided to the electrode in the body 111 of the substrate support 11. In other words, the bias power LF may have a power of 0 W.

In step ST6, the substrate support 11 may have a temperature of −20° C. or higher. The substrate support 11 may have a temperature of 100° C. or lower.

The processing duration in step ST6 may be shorter than the processing duration in step ST2. The processing duration in step ST6 may be adjusted in accordance with the depth of the recess RS. For example, the processing duration in step ST6 may be longer for a greater depth of the recess RS.

Step ST6 may be performed as described below. The gas supply unit 20 first supplies the second process gas containing tungsten into the plasma processing chamber 10. The plasma generator 12 then generates the second plasma PL2 from the second process gas in the plasma processing chamber 10. The controller 2 controls the gas supply unit 20 and the plasma generator 12 to supply the second plasma PL2 to the substrate W.

In step ST7, the recess RS is etched with third plasma PL3 generated from a third process gas as shown in FIG. 7. The etching conditions in step ST7 may be the same as the etching conditions in step ST2.

The third process gas may contain a gas containing carbon and fluorine. The third process gas may contain a $C_xH_yF_z$ gas (x and z are integers greater than or equal to 1, and y is an integer greater than or equal to 0). The third process gas may contain an oxygen-containing gas. The oxygen-containing gas may contain an oxygen gas and a carbonyl sulfide (COS) gas.

Step ST7 may be performed as described below. The gas supply unit 20 first supplies the third process gas into the plasma processing chamber 10. The plasma generator 12 then generates the third plasma PL3 from the third process gas in the plasma processing chamber 10. The controller 2 controls the gas supply unit 20 and the plasma generator 12 to etch the recess RS with the third plasma PL3.

In step ST8, a deposit in the opening OP in the mask MK resulting from step ST7 is removed. Step ST8 may be performed under the same conditions as in step ST3.

In step ST9, the determination is performed as to whether a processing count N in step ST7 is greater than a threshold No. When the processing count N is less than the threshold No, the processing returns to step ST7. In this case, steps ST7 and ST8 are repeated. When the processing count N is greater than the threshold No, the processing then advances to step ST10.

In step ST10, the determination is performed as to whether a processing count M in step ST6 is greater than a threshold Mo. When the processing count M is less than the threshold Mo, the processing returns to step ST5. In this case, steps ST5 to ST9 are repeated. When the processing count M is greater than the threshold Mo, the processing advances to subsequent step ST11. For example, with the threshold Mo set to 3, step ST6 is performed four times. The processing count M may be adjusted in accordance with the depth of the recess RS. For example, the processing count M may be increased for a greater depth of the recess RS.

In step ST11, the recess RS is etched with plasma generated from a process gas. This causes the recess RS to be overetched as shown in FIGS. 8 and 9. After step ST11, the bottom RSb of the recess RS may reach the underlying region UR. After step ST11, an electronic device can be manufactured with the substrate W. The electronic device may be a NAND flash memory with a three-dimensional structure.

With the method MT, the recess RS can have less edge roughness. The recess RS with a line pattern can have less line edge roughness (LER). The recess RS with a hole pattern can have more dimensional uniformity (e.g., round-ness). The LER of the recess RS is calculated by measuring a deviation from a reference line along one edge of the bottom RSb of the recess RS, as viewed in the thickness direction of the silicon-containing film SF. With the method MT, a recess with an intended shape can be formed. The mechanism is identified as described below, but is not limited to this example.

Figure 10:
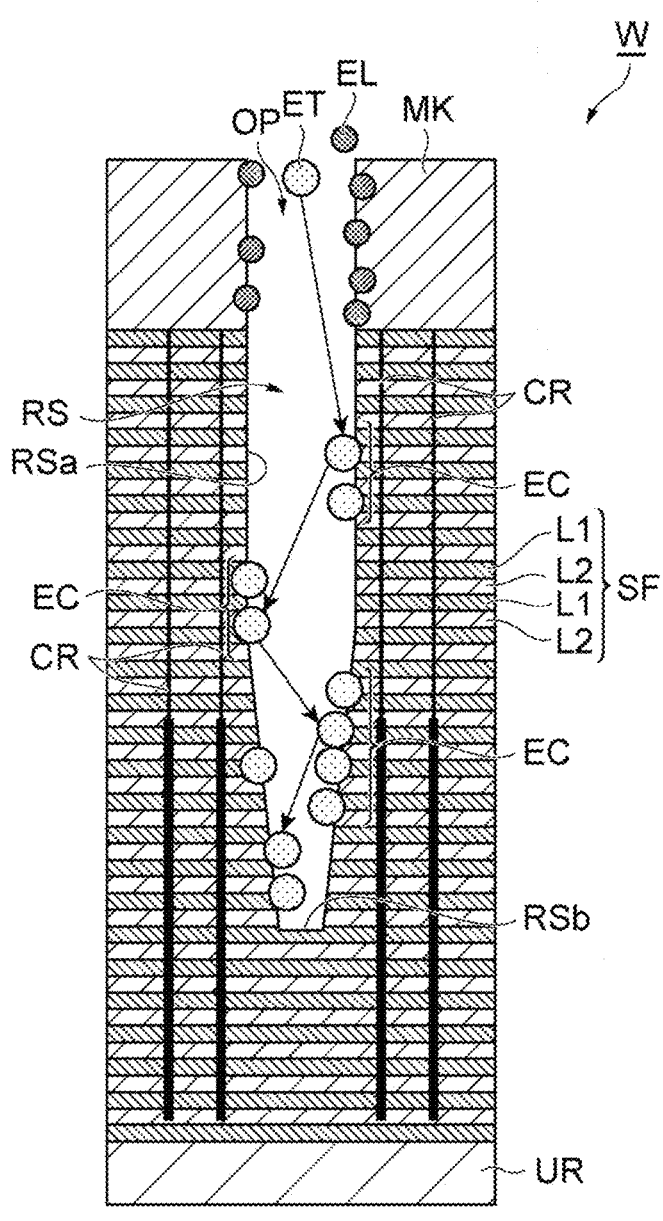
FIG. 10 is a cross-sectional view of the recess formed by etching, showing an example mechanism that causes more edge roughness.

FIG. 10 is a cross-sectional view of the recess formed by etching, showing an example mechanism of more edge roughness. When the recess RS is formed by etching, electrons EL are trapped in the mask MK. The side walls RSa of the recess RS are unevenly charged with a positive charge, partially forming charged portions EC in the side walls RSa of the recess RS. When step ST6 is not performed, positive ions ET in the plasma for etching bounce off the charged portion EC and etch the opposite side wall RSa. This causes more edge roughness of the recess RS. With the side wall RSa of the recess RS being etched, the conductive portion CR may be exposed on the side wall RSa.

Figure 11:
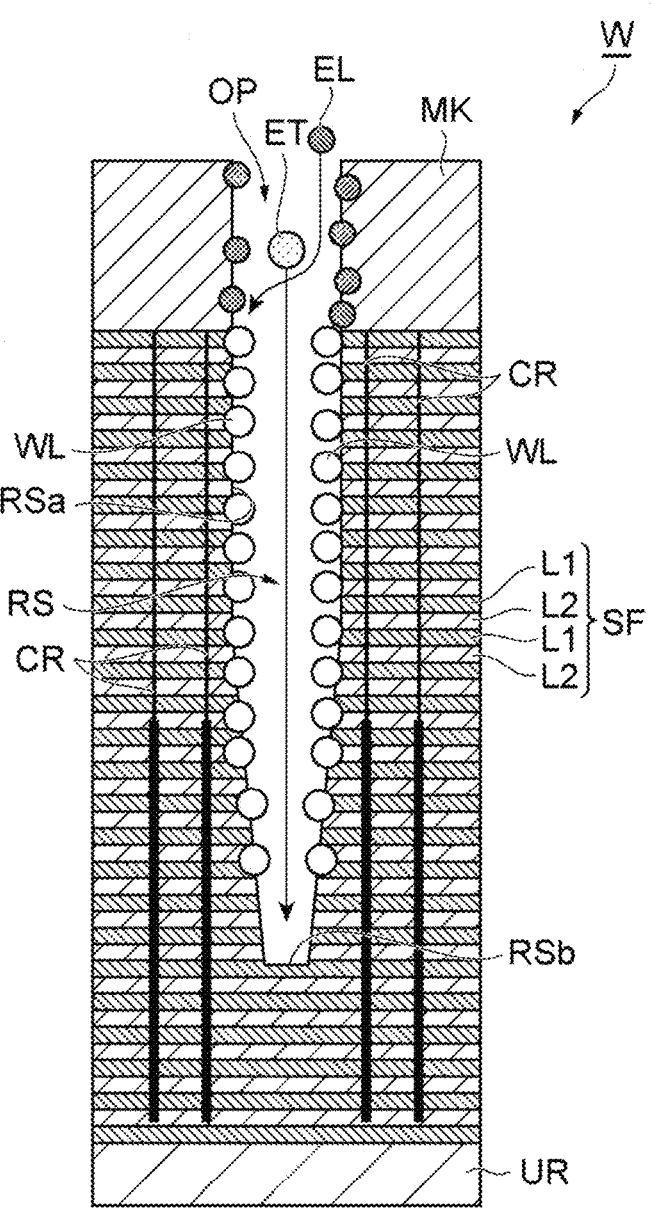
FIG. 11 is a cross-sectional view of the recess formed by etching, showing an example mechanism of less edge roughness.

FIG. 11 is a cross-sectional view of the recess formed by etching, showing an example mechanism of less edge rough-ness. When step ST6 is performed, the conductive tungsten-containing layers WL are formed on the side walls RSa of the recess RS. This removes the positive electric charge on the charged side walls RSa. This directs the positive ions ET more linearly into the recess RS, allowing the recess RS to have less edge roughness.

With the method MT including at least one of steps ST3 or ST8, the opening OP in the mask MK can be less narrow. The corresponding recess RS can thus also be less narrow.

The method MT including step ST5 allows removal of an organic substance adhering to the substrate W. This may facilitate formation of the tungsten-containing layers WL on the side walls RSa of the recess RS.

With the method MT including steps ST6 and ST7 performed repeatedly, the side walls RSa of the recess RS have less edge roughness further. This may result from the tungsten-containing layers WL on the side walls RSa exposed by etching of the recess RS in step ST7.

Control aspects of the present disclosure may be embod-ied as a system, a method, and/or a computer program product. The computer program product may include a computer readable storage medium on which computer readable program instructions are recorded that may cause one or more processors to carry out aspects of the embodi-ment.

The computer readable storage medium may be a tangible device that can store instructions for use by an instruction execution device (processor). The computer readable stor-age medium may be, for example, but is not limited to, an electronic storage device, a magnetic storage device, an optical storage device, an electromagnetic storage device, a semiconductor storage device, or any appropriate combina-tion of these devices. A non-exhaustive list of more specific examples of the computer readable storage medium includes each of the following (and appropriate combinations): flex-ible disk, hard disk, solid-state drive (SSD), random access memory (RAM), read-only memory (ROM), erasable programmable read-only memory (EPROM or Flash), static random access memory (SRAM), compact disc (CD or CD-ROM), digital versatile disk (DVD) and memory card or stick. A computer readable storage medium, as used in this disclosure, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described in this disclosure can be downloaded to an appropriate computing or processing device from a computer readable storage medium or to an external computer or external storage device via a global network (i.e., the Internet), a local area network, a wide area network and/or a wireless network. The network may include copper transmission wires, optical communication fibers, wireless transmission, routers, fire-walls, switches, gateway computers and/or edge servers. A network adapter card or network interface in each comput-ing or processing device may receive computer readable program instructions from the network and forward the computer readable program instructions for storage in a computer readable storage medium within the computing or processing device.

Computer readable program instructions for carrying out operations of the present disclosure may include machine language instructions and/or microcode, which may be compiled or interpreted from source code written in any combination of one or more programming languages, including assembly language, Basic, Fortran, Java, Python, R, C, C++, C# or similar programming languages. The computer readable program instructions may execute entirely on a user's personal computer, notebook computer, tablet, or smartphone, entirely on a remote computer or computer server, or any combination of these computing devices. The remote computer or computer server may be connected to the user's device or devices through a com-puter network, including a local area network or a wide area network, or a global network (i.e., the Internet). In some embodiments, electronic circuitry including, for example, programmable logic circuitry, field-programmable gate arrays (FPGA), or programmable logic arrays (PLA) may execute the computer readable program instructions by using information from the computer readable program instructions to configure or customize the electronic cir-cuitry, in order to perform aspects of the present disclosure.

Aspects of the present disclosure are described herein with reference to flow diagrams and block diagrams of methods, apparatus (systems), and computer program prod-ucts according to embodiments of the disclosure. It will be understood by those skilled in the art that each block of the flow diagrams and block diagrams, and combinations of blocks in the flow diagrams and block diagrams, can be implemented by computer readable program instructions.

The computer readable program instructions that may implement the systems and methods described in this dis-closure may be provided to one or more processors (and/or one or more cores within a processor) of a general purpose computer, special purpose computer, or other programmable apparatus to produce a machine, such that the instructions, which execute via the processor of the computer or other programmable apparatus, create a system for implementing the functions specified in the flow diagrams and block diagrams in the present disclosure. These computer readable program instructions may also be stored in a computer readable storage medium that can direct a computer, a programmable apparatus, and/or other devices to function in a particular manner, such that the computer readable storage medium having stored instructions is an article of manufacture including instructions which implement aspects of the functions specified in the flow diagrams and block diagrams in the present disclosure.

The computer readable program instructions may also be loaded onto a computer, other programmable apparatus, or other device to cause a series of operational steps to be performed on the computer, other programmable apparatus or other device to produce a computer implemented process, such that the instructions which execute on the computer, other programmable apparatus, or other device implement the functions specified in the flow diagrams and block diagrams in the present disclosure.

Figure 13:
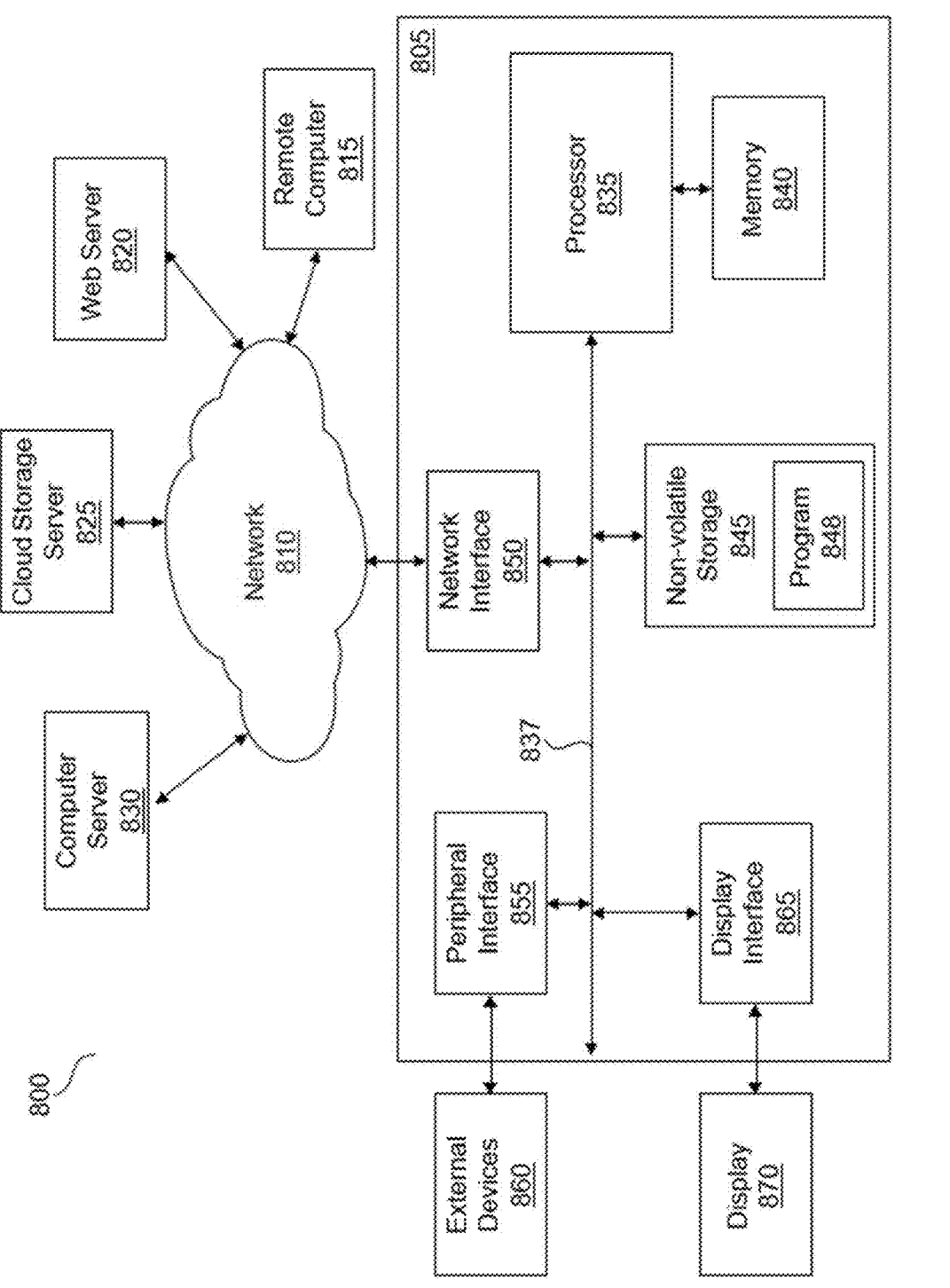
FIG. 13 is a block diagram of a computer-based system that serves as a controller that controls processes performed in embodiments according to the present disclosure.

FIG. 13 is a functional block diagram illustrating a networked system 800 of one or more networked computers and servers. In an embodiment, the hardware and software environment illustrated in FIG. 13 may provide an exemplary platform for implementation of the software and/or methods according to the present disclosure.

Referring to FIG. 13, a networked system 800 may include, but is not limited to, computer 805, network 810, remote computer 815, web server 820, cloud storage server 825 and computer server 830. In some embodiments, multiple instances of one or more of the functional blocks illustrated in FIG. 13 may be employed.

Additional detail of computer 805 is shown in FIG. 13. The functional blocks illustrated within computer 805 are provided only to establish exemplary functionality and are not intended to be exhaustive. And while details are not provided for remote computer 815, web server 820, cloud storage server 825 and computer server 830, these other computers and devices may include similar functionality to that shown for computer 805.

Computer 805 may be a personal computer (PC), a desktop computer, laptop computer, tablet computer, netbook computer, a personal digital assistant (PDA), a smart phone, or any other programmable electronic device capable of communicating with other devices on network 810.

Computer 805 may include processor 835, bus 837, memory 840, non-volatile storage 845, network interface 850, peripheral interface 855 and display interface 865. Each of these functions may be implemented, in some embodiments, as individual electronic subsystems (integrated circuit chip or combination of chips and associated devices), or, in other embodiments, some combination of functions may be implemented on a single chip (sometimes called a system on chip or SoC).

Processor 835 may be one or more single or multi-chip microprocessors, such as those designed and/or manufactured by Intel Corporation, Advanced Micro Devices, Inc. (AMD), Arm Holdings (Arm), Apple Computer, etc. Examples of microprocessors include Celeron, Pentium, Core i3, Core i5 and Core i7 from Intel Corporation; Opteron, Phenom, Athlon, Turion and Ryzen from AMD; and Cortex-A, Cortex-R and Cortex-M from Arm.

Bus 837 may be a proprietary or industry standard high-speed parallel or serial peripheral interconnect bus, such as ISA, PCI, PCI Express (PCI-e), AGP, and the like.

Memory 840 and non-volatile storage 845 may be computer-readable storage media. Memory 840 may include any suitable volatile storage devices such as Dynamic Random Access Memory (DRAM) and Static Random Access Memory (SRAM). Non-volatile storage 845 may include one or more of the following: flexible disk, hard disk, solid-state drive (SSD), read-only memory (ROM), erasable programmable read-only memory (EPROM or Flash), compact disc (CD or CD-ROM), digital versatile disk (DVD) and memory card or stick.

Program 848 may be a collection of machine readable instructions and/or data that is stored in non-volatile storage 845 and is used to create, manage and control certain software functions that are discussed in detail elsewhere in the present disclosure and illustrated in the drawings. In some embodiments, memory 840 may be considerably faster than non-volatile storage 845. In such embodiments, program 848 may be transferred from non-volatile storage 845 to memory 840 prior to execution by processor 835.

Computer 805 may be capable of communicating and interacting with other computers via network 810 through network interface 850. Network 810 may be, for example, a local area network (LAN), a wide area network (WAN) such as the Internet, or a combination of the two, and may include wired, wireless, or fiber optic connections. In general, network 810 can be any combination of connections and protocols that support communications between two or more computers and related devices.

Peripheral interface 855 may allow for input and output of data with other devices that may be connected locally with computer 805. For example, peripheral interface 855 may provide a connection to external devices 860. External devices 860 may include devices such as a keyboard, a mouse, a keypad, a touch screen, and/or other suitable input devices. External devices 860 may also include portable computer-readable storage media such as, for example, thumb drives, portable optical or magnetic disks, and memory cards. Software and data used to practice embodiments of the present disclosure, for example, program 848, may be stored on such portable computer-readable storage media. In such embodiments, software may be loaded onto non-volatile storage 845 or, alternatively, directly into memory 840 via peripheral interface 855. Peripheral interface 855 may use an industry standard connection, such as RS-232 or Universal Serial Bus (USB), to connect with external devices 860.

Display interface 865 may connect computer 805 to display 870. Display 870 may be used, in some embodiments, to present a command line or graphical user interface to a user of computer 805. Display interface 865 may connect to display 870 using one or more proprietary or industry standard connections, such as VGA, DVI, DisplayPort and HDMI.

As described above, network interface 850, provides for communications with other computing and storage systems or devices external to computer 805. Software programs and data discussed herein may be downloaded from, for example, remote computer 815, web server 820, cloud storage server 825 and computer server 830 to non-volatile storage 845 through network interface 850 and network 810. Furthermore, the systems and methods described in this disclosure may be executed by one or more computers connected to computer 805 through network interface 850 and network 810. For example, in some embodiments the systems and methods described in this disclosure may be executed by remote computer 815, computer server 830, or a combination of the interconnected computers on network 810.

Data, datasets and/or databases employed in embodiments of the systems and methods described in this disclosure may be stored and or downloaded from remote computer 815, web server 820, cloud storage server 825 and computer server 830.

Circuitry as used in the present application can be defined as one or more of the following: an electronic component (such as a semiconductor device), multiple electronic components that are directly connected to one another or interconnected via electronic communications, a computer, a network of computer devices, a remote computer, a web server, a cloud storage server, a computer server. For example, each of the one or more of the computer, the remote computer, the web server, the cloud storage server, and the computer server can be encompassed by or may include the circuitry as a component(s) thereof. In some embodiments, multiple instances of one or more of these components may be employed, wherein each of the multiple instances of the one or more of these components are also encompassed by or include circuitry. In some embodiments, the circuitry represented by the networked system may include a serverless computing system corresponding to a virtualized set of hardware resources. The circuitry represented by the computer may be a personal computer (PC), a desktop computer, a laptop computer, a tablet computer, a netbook computer, a personal digital assistant (PDA), a smart phone, or any other programmable electronic device capable of communicating with other devices on the network. The circuitry may be a general purpose computer, special purpose computer, or other programmable apparatus as described herein that includes one or more processors. Each processor may be one or more single or multi-chip microprocessors. Processors are considered processing circuitry or circuitry as they include transistors and other circuitry therein. The circuitry may implement the systems and methods described in this disclosure based on computer-readable program instructions provided to the one or more processors (and/or one or more cores within a processor) of one or more of the general purpose computer, special purpose computer, or other programmable apparatus described herein to produce a machine, such that the instructions, which execute via the one or more processors of the programmable apparatus that is encompassed by or includes the circuitry, create a system for implementing the functions specified in the flow diagrams and block diagrams in the present disclosure. Alternatively, the circuitry may be a preprogrammed structure, such as a programmable logic device, application specific integrated circuit, or the like, and is/are considered circuitry regardless if used in isolation or in combination with other circuitry that is programmable, or preprogrammed.

Although the exemplary embodiments have been described above, the embodiments are not restrictive, and various additions, omissions, substitutions, and changes may be made. The components in the different exemplary embodiments may be combined to form another exemplary embodiment.

Various experiments conducted for evaluating the method MT will now be described. The experiments described below are not intended to limit the present disclosure.

First Experiment

A substrate W including a silicon-containing film SF and a mask MK was prepared. The silicon-containing film SF includes silicon oxide films and silicon nitride films alternately stacked on one another.

The substrate W was processed with the method MT. Step ST5 was not performed. In step ST6, the processing count M was 1.

Second Experiment

The same method as in the first experiment was used, except the processing count M of 4 in step ST6.

Third Experiment same method as in the first experiment was used, except the processing count M of 18 in step ST6.

Fourth Experiment

The same method as in the first experiment was used, except the processing count M of 4 in step ST6 and step ST5 being performed. In other words, the same method as in the second experiment was used, except step ST5 being performed.

Fifth Experiment

The same method as in the first experiment was used, except that step ST6 not being performed.

LER Evaluation of Recess

Figure 12A:
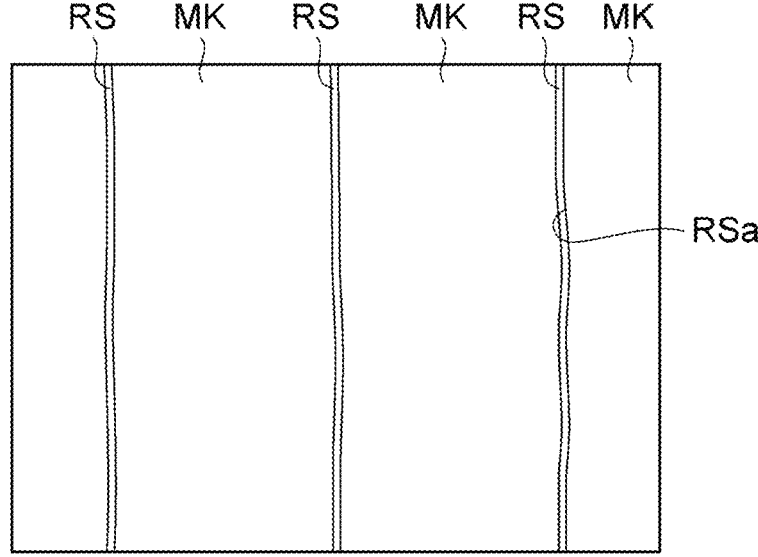
FIGS. 12A and 12B are schematic plan views of example recesses formed by etching in the fourth and fifth experiments.
Figure 12B:
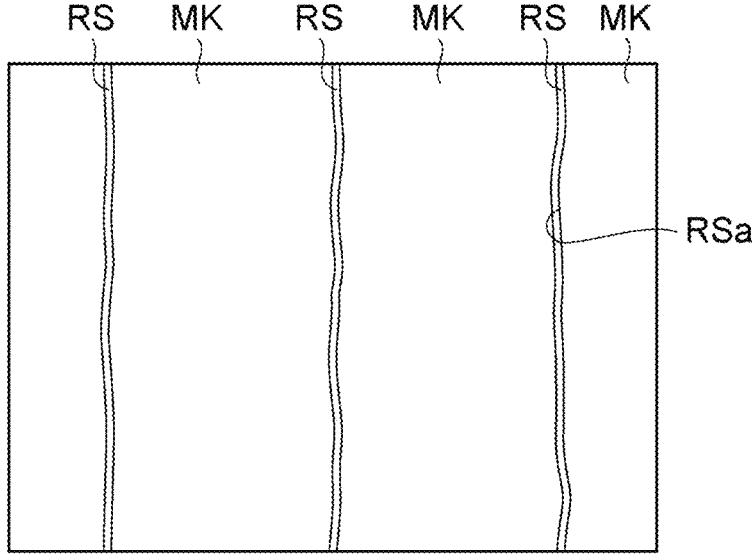

Each recess RS formed by etching in the first to fifth experiments was inspected, and the LER of the recess RS was measured. FIGS. 12A and 12B are schematic plan views of example recesses formed by etching in the fourth and fifth experiments. FIG. 12A shows the results in the fourth experiment. FIG. 12B shows the results in the fifth experiment.

In the fourth experiment, the recess RS had less LER than the recess RS in the fifth experiment. In the fourth experiment, the recess RS had the LER of 31.1 nm. In the fifth experiment, the recess RS had the LER of 56.1 nm. The LER of the recess RS was measured as described below. For each of the 30 line patterns (recesses RS), any deviation from the reference line along one edge of the bottom RSb of the recess RS was measured, and the average of the measured values was used as the LER of the recess RS. The recesses RS in the first to third experiments also had less LER than the recess RS in the fifth experiment.

Cross-Sectional Shape Evaluation of Recess

The cross-sectional shape of each recess RS formed by etching in the first to fifth experiments was inspected. The side walls RSa in the first to fourth experiments had surface roughness less than the surface roughness of the side walls RSa in the fifth experiment.

Bottom Shape Evaluation of Recess

The shape of the bottom RSb of each recess RS formed by etching in the first to fifth experiments was inspected. The bottoms RSb in the first to fourth experiments were each more approximate to a circle than the bottom RSb in the fifth experiment.

The exemplary embodiments according to the present disclosure have been described by way of example, and various changes may be made without departing from the scope and spirit of the present disclosure. The exemplary embodiments disclosed above are thus not restrictive, and the true scope and spirit of the present disclosure are defined by the appended claims.

REFERENCE SIGNS LIST

1 Plasma processing apparatus
2 Controller
10 Plasma processing chamber
11 Substrate support 12 Plasma generator
20 Gas supply unit
BD Boundary
BD1 Slope
MK Mask
PL1 First plasma
PL2 Second plasma
PL3 Third plasma
R1 First region
R2 Second region
RS Recess
SF Silicon-containing film
W Substrate

What is claimed is:

1. An etching method, comprising:

(a) providing a substrate, the substrate including a silicon-containing film and a mask on the silicon-containing film;

(b) etching, while a bias power greater than zero is provided to a support of the substrate, the silicon-containing film with a first plasma to form a recess, wherein the first plasma is generated from a first process gas;

(c) forming a tungsten-containing layer on a side wall of the recess by supplying, while zero bias power is provided to the support, a second plasma to the substrate, wherein the second plasma is generated from a second process gas comprising tungsten; and (d) etching the recess with a third plasma generated from a third process gas.

2. The etching method according to claim 1, wherein (b) includes generating the first plasma at a first pressure, and (c) includes generating the second plasma at a second pressure higher than the first pressure.

3. The etching method according to claim 1, wherein (b) includes providing a first radio-frequency power, separate from the bias power, to generate the first plasma, and (c) includes providing a second radio-frequency power, separate from the bias power, at a lower power level than the first radio-frequency power to generate the second plasma.

4. The etching method according to claim 1, further comprising:

(e) removing a deposit in an opening in the mask resulting from (b) and before (c).

5. The etching method according to claim 1, further comprising:

(f) supplying a fourth plasma to the substrate after (b) and before (c), the fourth plasma generated from a fourth process gas comprising an oxygen-containing gas.

6. The etching method according to claim 1, wherein (c) and (d) are repeated after (d).

7. The etching method according to claim 1, wherein the silicon-containing film includes a first layer comprising a first material comprising silicon and a second layer comprising a second material different from the first material, and the first layer and the second layer are alternately stacked on one another.

8. The etching method according to claim 7, wherein the first material comprises silicon oxide.

9. The etching method according to claim 7, wherein the second material comprises silicon nitride.

10. The etching method according to claim 1, wherein the second process gas comprises a tungsten-containing gas.

11. The etching method according to claim 1, wherein the second process gas comprises a tungsten hexafluoride gas.

12. The etching method according to claim 1, wherein the first process gas comprises a $C_xH_yF_z$ gas, where x and z are integers greater than or equal to 1, and y is an integer greater than or equal to 0.

13. The etching method according to claim 1, wherein the third process gas comprises a $C_xH_yF_z$ gas, where x and z are integers greater than or equal to 1, and y is an integer greater than or equal to 0.

14. An etching method, comprising:

(a) providing a substrate, the substrate including a silicon-containing film and a mask on the silicon-containing film, and the silicon-containing film including silicon oxide films and silicon nitride films alternately stacked on one another;

(b) etching, while a bias power greater than zero is provided to a support of the substrate, the silicon-containing film with a first plasma to form a recess, wherein the first plasma is generated from a first process gas comprising a $C_xH_yF_z$ gas and an oxygen-containing gas, where x and z are integers greater than or equal to 1, and y is an integer greater than or equal to 0;

(c) forming a tungsten-containing layer on a side wall of the recess by supplying, while zero bias power is provided to the support, a second plasma to the substrate, wherein the second plasma is generated from a second process gas comprising a tungsten hexafluoride gas; and (d) etching the recess with a third plasma generated from a third process gas comprising a $C_xH_yF_z$ gas and an oxygen-containing gas, where x and z are integers greater than or equal to 1, and y is an integer greater than or equal to 0.

* * * * *